United States Patent [19]

Strachan et al.

[11] Patent Number: 5,288,336
[45] Date of Patent: Feb. 22, 1994

[54] THERMOELECTRIC ENERGY CONVERSION

[75] Inventors: John S. Strachan, Edinburgh, Scotland; Harold Aspden, Southampton, England

[73] Assignee: Dr. Harold Aspden, Chilworth

[21] Appl. No.: 439,829

[22] Filed: Nov. 20, 1989

[30] Foreign Application Priority Data

| Nov. 18, 1988 | [GB] | United Kingdom | 8826952 |
| Dec. 5, 1988 | [GB] | United Kingdom | 8828307 |
| Sep. 12, 1989 | [GB] | United Kingdom | 8920580 |

[51] Int. Cl.$^5$ ............................. H01L 35/04
[52] U.S. Cl. ............... 136/200; 136/203; 136/204; 136/205; 136/211; 136/212; 136/224; 136/225; 136/226
[58] Field of Search ............ 136/200, 203, 204, 205, 136/206, 208, 211, 212, 224, 225, 226, 227; 322/2 R; 310/306

[56] References Cited

U.S. PATENT DOCUMENTS

| 1,809,475 | 6/1931 | Dowler, Jr. | 315/55 |
| 2,139,504 | 12/1938 | King | 158/28 |
| 2,919,553 | 10/1960 | Fritts | 62/3 |
| 2,944,404 | 7/1960 | Fritts | 62/3 |
| 2,981,775 | 4/1961 | Bachman et al. | 136/5 |
| 3,284,245 | 11/1966 | Nottage | 136/212 |
| 3,441,449 | 4/1969 | Green | 136/203 |
| 3,460,015 | 8/1969 | Hines | 318/117 |
| 3,969,149 | 7/1976 | Thomas et al. | 136/225 |
| 3,977,904 | 8/1976 | Köhler | 136/89 |
| 4,276,441 | 6/1981 | Wilson | 136/206 |
| 4,492,809 | 1/1985 | Dahlberg | 136/212 |
| 4,631,350 | 12/1986 | Germanton et al. | 136/225 |
| 4,779,994 | 10/1988 | Diller et al. | 374/29 |
| 4,786,335 | 11/1988 | Knowles | 136/214 |
| 4,828,627 | 5/1989 | Connery | 136/203 |

FOREIGN PATENT DOCUMENTS

| 142829 | 11/1901 | Fed. Rep. of Germany | 136/210 |
| 3202791 | 8/1983 | Fed. Rep. of Germany | |
| 233014 | 2/1986 | Fed. Rep. of Germany | |
| 3523773 | 1/1987 | Fed. Rep. of Germany | |
| 3627747 | 3/1987 | Fed. Rep. of Germany | |
| 61-284976 | 12/1986 | Japan | 136/205 |
| 1-208876 | 8/1989 | Japan | 136/200 |
| 2-103969 | 4/1990 | Japan | 136/200 |
| 1016102 | 1/1966 | United Kingdom | |

OTHER PUBLICATIONS

UK Search Report, Jan. 30, 1990, 1 page.
EPO Search Report, Mar. 31, 1992, 1 page.
Annex to EPO on EP Appl. No. 89311559.2, 1 page.

*Primary Examiner*—Donald P. Walsh
*Assistant Examiner*—Chrisman D. Carroll
*Attorney, Agent, or Firm*—Ratner & Prestia

[57] ABSTRACT

A thermopile 30 comprises a stacked assembly of bimetallic layers in which there is full conductor interface contact over the distance separating hot and cold surfaces 31, 32. The assembly may include dielectric layers forming a capacitor stack. A.C. current through the stack is matched in strength to the Seebeck-generated thermoelectric current circulating in each bimetallic layer. The resulting current snakes through the stack to cause Peltier cooling at one heat surface and heating at the other. A.C. operation at a kilocycle frequency enhances the energy conversion efficiency as does heat flow parallel with the junction interface.

12 Claims, 2 Drawing Sheets

THERMOELECTRIC ENERGY CONVERSION

FIELD OF INVENTION

This invention relates to energy conversion by thermoelectric techniques. In particular, it relates to a novel method by which a temperature differential can either be established by supplying electrical power or utilized to generate such electrical power.

Conventional thermoelectric energy conversion devices use the Peltier effect or the converse, the Seebeck effect. Hot and cold junctions connect dissimilar metals in a closed circuit and the EMF develops current in the circuit in a measure related to the temperature differential and rate of heat input or output. However, such devices find little application as energy sources, owing to their poor conversion efficiency. The design criteria for minimizing ohmic resistance loss, e.g. by having the junctions in close proximity, maximize the heat loss by heat conduction. For this reason the use in thermopiles of inexpensive metallic materials, which are good electrical conductors, is not generally deemed practical.

To achieve tolerable efficiencies, as in refrigeration systems, research has tended to concentrate upon the use of semi-conductor techniques or alloys of substances which are expensive. Evenso, the power conversion efficiencies of known thermocouple devices cannot compare with the efficiency of the heat to electricity conversion of conventional electrical power generation using heat engines.

This invention overcomes the above deficiency in thermoelectric circuit design. It implements a novel principle in a special way with the result that high efficiencies of power conversion from heat to electricity or vice versa can be achieved without using expensive materials.

It is foreseen that apparatus implementing this principle can ultimately replace the heat engines used as the prime movers in electric power generation. However, inasmuch as the apparatus can operate efficiently with low temperature differentials measured in tens of degrees rather than hundreds, an intermediate application will be that of generating electricity from what is hitherto regarded as waste heat in conventional systems.

In the reverse mode, where electricity is used to set up temperature differentials, the invention provides solid state cooling apparatus of such efficiency that wholly new kinds of technological design become feasible. Such applications relate to air conditioning, refrigeration and cryogenic systems.

BACKGROUND TO THE INVENTION

In summary, this invention relates to a new kind of thermoelectric circuit based on the Peltier and Seebeck Effects. It departs from what is conventional by applying a combination of novel principles, one of which amounts to a scientific breakthrough, being a discovery emerging from extensive diagnostic tests on a research prototype which was described in the specification of U.K. Patent Application No. 8,828,307 filed on Dec. 5, 1988, the latter also being based on U.K. Patent application No. 8,826,952 filed on Nov. 18, 1988.

The invention there disclosed aimed to obstruct heat flow between the hot and cold thermocouple junctions, whilst admitting the passage of electric current through the junctions in a way which involves a net energy conversion. A capacitative structure in which the dielectric served also as the heat insulator featured in that invention. In contrast, the invention to be described in this specification, does not obstruct heat flow but rather directs the heat flow along a junction interface to give it repeated opportunity to be involved in the thermoelectric power conversion before it reaches a position midway between the hot and cold external surfaces. This enhances the efficiency of power conversion, but, in itself, given a junction combination with a low thermoelectric power or a poor electrically conductive property, this is a technological feature offering only limited commercial advantage. It becomes particularly advantageous when combined with a novel method for enhancing the thermoelectric power as measured by the Seebeck coefficient of the thermocouple.

Since what is to be specifically described is a very compact thermopile system in which numerous junctions share in enhancing the voltage rating of the device, it is appropriate to refer to a prior proposal which forms the subject of U.S. Pat. No. 4,276,441. This patent names as inventor Kenneth T. Wilson and discloses a method of fabrication of a thermoelectric circuit using a multiplicity of thermocouples formed by metallic ink printing on a narrow strip substrate layer. The bimetallic junctions are formed by a melting operation and the disclosure in that patent specification is wholly concerned with assembly and production methods. There is no suggestion that any novel electrical operating principles are involved or that dimensional features are scaled to exploit those principles. Therefore, the device fabricated according to the Wilson patent, though providing for simple voltage enhancement by series connection of a multiplicity of thermocouple junctions, suffers from the poor efficiency characteristic of conventional base metal thermopiles. It must have substantial heat losses owing to thermal conduction through the metal conductor sections linking the junctions.

Other than the description in their own as yet unpublished U.K. Patent Applications Nos. 8.826,952 and 8,828,307 mentioned above, the inventors also declare that they have no knowledge of any prior disclosure which is based on the conception that a thermocouple device can operate by current passage in a fast-cycling A.C. mode. This principle features in the invention to be described. Indeed, the normal expectation of such a proposal would be that the cyclic heating and cooling of each thermocouple junction at the operating frequency should have no advantage for energy transfer and should merely generate ohmic loss and lose heat by thermal conduction.

BRIEF DESCRIPTION OF THE INVENTION

The objective of the invention is to provide thermoelectric energy conversion using solid state technology which is robust in construction and operates between two external heat transfer interfaces to convert heat energy into an electrical output or electrical input energy into a thermal output.

Another objective is to utilize electrically conductive substances which are highly conductive at the operating temperatures so as to minimize ohmic power losses, but to fabricate the conversion apparatus in a way which converts heat to electricity or electricity to heat with a minimal heat wastage by thermal conduction between the heat transfer interfaces.

A further objective is to operate the electrical control excitation of the thermocouple circuits in the apparatus in such a way as to produce a greater thermoelectric power from each thermocouple junction than is deemed possible using conventional technology.

The latter objective concerns what will be referred to as 'cold spot' formation in the cooled junction of a thermocouple. A technique of dynamic current excitation of the thermocouple circuit aims at minimizing cold spot formation in the cooled junction and can best be understood by realizing that a concentrated current flow through one confined region of a junction will very rapidly cool that region. This means that any tendency of the current to seek out paths of least resistance will cause the current to migrate rapidly over the heated junction and through the body of the conductors linking the junctions but could trap the flow in the cold spot seated in the cooled junction. This is because, over the working temperature range, resistance reduces with temperature decrease in a base metal, but, curiously, not in some of the special alloys conventionally favoured in thermoelectric generators.

By 'dynamic current excitation' is meant an action which interrupts the current flow before the cold spot temperature can drop appreciably, thereby allowing the restoration of current flow to establish another flow route at random. This process requires a rapid cyclic interruption rate, but the mean current flow through a particular junction has to be unidirectional to assert the thermoelectric action. The junction current has to be predominantly unidirectional with the cyclic interruption switching off the current or reversing it momentarily.

It is believed that a steady magnetic field acting on a current flowing through the cooled junction and having a tendency to lock in position at a cold spot can set up Lorentz forces which tend to displace the preferred flow path. Thus a magnetic field can in some measure have a similar effect to the dynamic current excitation proposed. For this reason, there are advantages in using ferromagnetic substances for at least one of the conductor forms in the thermopile. However, the dynamic current excitation feature is not seen as the primary feature of this invention, but the advantages of the invention are best realized by ensuring that the cold spot effects are minimal.

According to the invention, a thermoelectric energy conversion apparatus comprises a thermopile formed by a laminar assembly of two conductor substances A and B located between external heat sink surfaces across which heat is transferred when the surfaces have different temperatures, there being pairs of thermocouple junctions formed between the substances A and B, activated by thermoelectric action powered by the temperature difference to cause current flow from A to B at an A-B junction interface and current flow from B to A at a B-A junction interface, and a supplementary current flow path connected to electrical circuit means including an electrical control unit linked to an external power system, the apparatus being characterized in that, in combination, (a) the A-B and B-A junctions of each thermocouple pair are both formed by surfaces of contact between the same pair of laminar conductor elements of substances A and B, and (b) said electrical control unit comprises means for admitting a regulated current to flow along that supplementary current path and through said laminar assembly in a direction transverse to the laminar surfaces of the conductor elements and means for modulating the current cyclically at a frequency in excess of one kilohertz, which current augments and offsets the thermoelectric current at the respective A-B and B-A junctions to cause the weaker junction current to be minimal and the stronger junction current to be predominantly unidirectional but subject to cyclic interruption at the modulating frequency.

The transverse arrangement can be understood in terms of orthogonal x, y, z coordinates if x is the axial path of heat flow and the y-z axes define a plane parallel to the two external thermal surfaces. Then, the surfaces of conductor junction contact would lie parallel with the plane defined by the x-z axis. The thermoelectric currents in the thermopile then flow in planes parallel with the plane defined by the x-y axes and, in the block conductor or capacitative conductor thermopiles to be described below, the external current has its flow direction parallel to the y axis. In all the embodiments of the invention to be described there is no provision for current flow parallel with the z axis. A thermopile having these orthogonal heat and current path features is particularly suited to the requirements of this invention and has minimal energy loss. This is especially so if the widths of the A and B laminar conductors, as measured in the z direction, are identical and uniformly the same over the x-directed distance separating the two thermal surfaces.

According to a feature of the invention, the A-B and B-A junction interfaces together extend over the whole distance separating the two thermal surfaces, the junctions being formed by contact between planar conductor elements of substances A and B.

This latter structure may have a continuous conductor form or be a capacitor stack. Thus, in the continuous or block conductor mode, the apparatus according to this invention is characterized in that a laminated assembly of planar conductor elements alternately of substances A and B have electrical contact over all interfacing A and B surfaces and said electrical control unit regulates the current flowing through the assembly and so through all the planar conductors. In the capacitative mode, the apparatus is characterized in that a laminated assembly of pairs of planar conductor elements of substances A and B and planar dielectric elements of an insulating substance constitutes a capacitor stack with a dielectric element separating each pair of conductor elements, each such pair having electrical contact over all interfacing A and B surfaces and said electrical control unit regulates the capacitor current flowing through the assembly and so through all the planar conductors.

An important aspect of the invention concerns a dynamic current excitation and involves apparatus characterized in that said electrical control unit comprises means for admitting a regulated current to flow through said junctions which is predominantly unidirectional and means for interrupting the current flow cyclically at a frequency in excess of 1 kilohertz.

Other inventive features concerned with fabrication and operation will be evident from the following detailed description, an important operating feature involving means for modulating the current cyclically at a frequency in excess of one kilohertz, which current augments and offsets the thermoelectric current at the respective A-B and B-A junctions to cause the weaker junction current to be minimal and the stronger junction current to be predominantly unidirectional but subject to cyclic interruption at the modulating frequency. Also, preferably, to achieve optimum thermoelectric power using base metal substances A and B, these must be respectively electropositive and electronegative in their electrical conduction characteristics at the operating temperature. It is also advantageous if at least one is ferromagnetic. Thus aluminium and nickel is a combination which can be used in implementing the invention. Furthermore, very considerable advantage arises from the use of planar metal layers which are thin films of such small thickness that the electrical conductivity is greatly increased relative to the thermal conductivity.

DETAILED DESCRIPTION OF THE INVENTION

Figure 1:
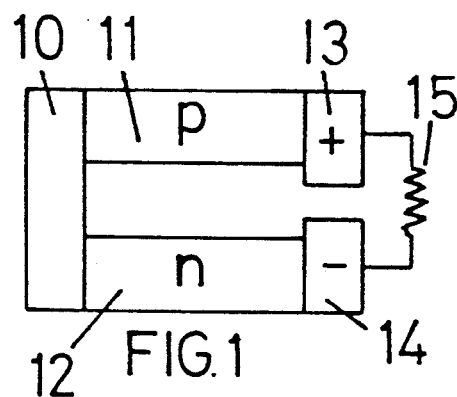
FIG. 1 shows a schematic prior art form of thermoelectric generator.

The performance criteria of thermoelectric apparatus using the Peltier or Seebeck Effects are usually represented by a quantity such as:

$$(\alpha)(\alpha)T\sigma/K \qquad [1]$$

where $\alpha$ denotes the thermoelectric power or Seebeck coefficient of a bimetallic junction in volts per degree Centigrade, T is the absolute temperature of the junction in Kelvin, $\sigma$ is the electrical conductivity of either of the two metals (assumed equal) and K is the thermal conductivity of the metals (also assumed equal).

Conventionally, the performance of a thermoelectric generator is expressed in terms of a figure of merit Z applied to a metal used to form the junction, where ZT is the expression in [1]. If the electrical conductivity of such a metal is approximately inversely proportional to T, then Z at a nominal temperature becomes a definitive parameter which measures the utility of that metal in a thermocouple combination at any temperature.

For the purpose of this description the above assumptions simplify the argument. Generally speaking, the greater this factor, the more efficient will be the thermoelectric energy conversion.

The actual efficiency is measured by the amount of heat needed to produce electricity or transferred by the use of electricity at two junctions having different temperatures, a high temperature T' and a low temperature T. The EMF produced by a pair of junctions at these temperatures is simply $(\alpha)$ (T'−T) and this develops a current density in unit length of conductor of $(\alpha)$ (T'−T)$\sigma$. The Peltier coefficient of the junction is $(\alpha)$T' at the hot junction and $(\alpha)$T at the cold junction and, when this is multiplied by the current through the junction, this gives the amount of electrical energy involved in the heat transformation at that junction. Therefore, the energy exchange at the hot junction, the primary energy exchange, is $(\alpha)$ $(\alpha)$ T'(T'−T)$\sigma$ this is a measure of the energy that can be said to be usefully active. In contrast, the corresponding heat lost by direct thermal conduction between the junctions is simply K.(T'−T). Bearing in mind that the two substances are connected electrically in series but thermally in parallel, the ratio of active energy to heat energy lost is one quarter of that presented in the expression [1], assuming that the metals used have the same conductivity properties.

It follows that if this ratio in [1] is 4 one can expect to lose half of the energy input plus any joule heating losses owing to current in the metals. The greater this factor, the greater the efficiency. However, even if the thermal conductivity K. were zero, the overall action of converting heat into electricity is still subject to the Carnot limit, corresponding to a maximum possible efficiency given by the factor:

$$(T'-T)/T' \qquad [2]$$

The problem which has faced those researching thermoelectric energy conversion is the task of finding combinations of materials for which the figure of merit Z times the operating temperature (expression [1] is higher than unity. This has led to combinations of materials such as semi-conductors or special alloys which offer high values of $\alpha$ but quite low values of electrical conductivity $\sigma$, albeit offset somewhat by somewhat lower values of the thermal conductivity K. Bismuth-telluride and combinations of bismuth and selenium or antimony and tellurium find use in such a situation, provided a factor for expression [1] a little above unity suffices.

It may be noted that the implementation of the invention to be described uses a bimetallic combination of Al and Ni. Such a combination, for which α is known to be of the order of 17 microvolts per degree Centigrade, offers a base metal structure with high conductivity but the figure of merit Z is so low that no more than one percent of the Carnot efficiency can be expected in a conventional implementation. This is, however, the state of the art before the discovery on which this invention is founded.

The inventors have established experimentally that it is possible to build and operate an Al—Ni thermocouple circuit at a level of efficiency which is far greater than that set by the above criteria. This is a wholly unexpected technological discovery, which should now divert development interest from the semiconductor implementations which have poor electrical conductivity and result in base metal technological implementations which exploit the high electrical conductivity properties.

The research has led to the conclusion that with normal base metal combinations the assumed or measured junction temperature differential, when operating in the Seebeck electrical power-generating mode, is invariably greater than that truly active at the junction being cooled by current flow. The reason is that the cooling effect is concentrated at the point where current crosses the junction. Cooling produces a lower resistance and this effect appears to produce a non-uniformity in the current distribution as more and more current tends to flow through a path of least resistance. Cold spots then form in the junction interface and the current flow becomes virtually trapped or locked into that flow path, conceivably to such an extent in certain base metal junctions that what may virtually be a transiently superconductive state is produced. The effect of this in a junction fed by external heat is to offset the active high temperature T' by an amount that can cause a loss of thermoelectric power by a remarkably high factor, seemingly on the experimental evidence of value 10 or more. Thus under normal circumstances, as experienced hitherto, α can be reduced from its theoretically expected value to one tenth of this, with a hundred-fold effect on the figure of merit given by expression [1].

Essentially, the inventors have discovered a way of preventing the formation of these cold spots and so realizing more of the thermoelectric power believed from physical theory to be potentially available. The thermoelectric power of metals having the same electrical carrier polarity is that given by Ehrenberg in his book "Electric Conduction in Semiconductors and Metals" (Clarendon Press, Oxford) pp. 21-23 (1958). The formula for the Seebeck coefficient is (kT/e) times the natural logarithm of the population density of the charge carriers, e being their electric charge, k being Boltzmann's constant and T the temperature of the junction in degrees absolute. Ehrenberg presents data showing that this logarithm, in the case of an aluminum-nickel junction, is 3.04 so that the expected theoretical value of α should be 265 microvolts per degree Centigrade. In contrast, his data reveal an experimentally observed value of α of 17 microvolts per degree, which is only 6.4% of the theoretical value. However, using more up-to-date data for the properties of these metals, particularly for the Hall effect, there is reason to believe that one is electropositive and one electronegative, meaning opposite polarity charge carriers. This implies a theoretical thermoelectric power according to a formula for which α is 3(kT/e) with no logarithmic dependence upon charge density. Either way, however, the value of α should, in theory, be close to 265 microvolts per degree.

It is therefore believed by the inventors that this potentially is the practical thermoelectric power, augmented also by a contribution from the Thomson effect owing to temperature gradient in the individual metals, and assuming that the junction cold spots can be avoided.

It is relevant to note that the efforts to develop special alloys and semi-conductor thermoelectric junctions, which suffer from the poor electrical conductivity of as much as one thousandth that of a metal such as aluminium, do achieve close to the theoretical maximum thermoelectric power. Thus Angrist in his book "Direct Energy Conversion", 3rd Ed. (Allyn and Bacon, Boston) p. 171 (1976) observes that: "It has been found in materials that have been doped to a maximum figure of merit, that the Seebeck coefficient is between 200 and 300 microvolts per degree Centigrade".

What conventional technology can achieve by these semi-conductor techniques, has now been achieved by the subject invention in normal metal conductors. Conceivably, in the semi-conductor, the current tends not to form a filamentary surge flow pattern which enhances the cold spot phenomenon. This may be influenced by the fact that the resistivity is higher and, in some of the special substances used, can increase with temperature decrease.

The specific implementation of the invention to be described incorporates three separate features all of which serve, by their individual and combined effects, to increase the figure of merit incorporated in expression [1]. These are:

(a) The dynamic excitation of the current circuit to cause the current flow across the bimetallic junctions to relocate rapidly and so reduce the tendency for cold spot formation.

(b) The configuration of the bimetallic junction interfaces with respect to the direction of heat flow so that the heat energy has a repeated opportunity to convert into electrical energy at the cooled junction interface before becoming waste heat by passing on through the metal by normal thermal conduction.

(c) The use of very thin metallic layers of thickness well below the mean free path of the charge carriers in the metals to obtain a much higher electrical conductivity. Typically electron mean free path at normal temperatures is of the order of 0.1 micron. Therefore a metal film of smaller thickness can have a specific electrical conductivity that is in consequence higher than applies to the same substance in bulk form.

Figure 2:
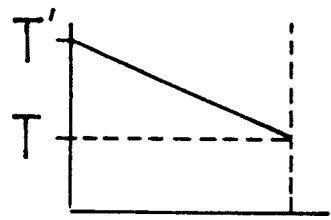
FIG. 2 shows a temperature profile between thermal surfaces in FIG. 1 as used in estimating operating performance of this prior art device.

These three features combine to increase the effective value of the figure of merit Z, the effect on α in expression [1] being the most significant owing to its presence as a squared term. The formulation assumes a linear temperature gradient between hot and cold thermal interfaces. Thus, in the prior art form of thermocouple shown in FIG. 1, a hot junction electrode 10 connects two conductor types 11 and 12, doped in this case to be respectively of the p and n form, and cold junction electrodes 13, 14 which feed a resistive load circuit 15. FIG. 2 shows the approximately linear temperature gradient in the conductors 11 and 12, as the temperature varies from T' at electrode 10 to T at electrodes 13, 14.

Figure 3:
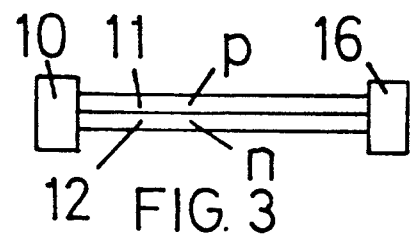
FIG. 3 shows a schematic form of thermoelectric energy converter incorporating the invention.
Figure 4:
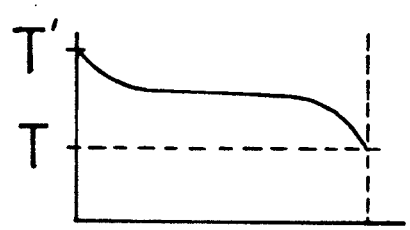
FIG. 4 shows a representative temperature profile applicable to the device shown in FIG. 3.

Referring now to FIG. 3 a thermocouple configuration is shown with the electropositive and electronegative p and n conductors 11, 12 in surface contact over the whole distance extending from the hot junction heat sink 10 to the cold junction heat sink 16. These heat sinks are not electrodes in the sense used in FIG. 1. The heat flow between the heat sinks is along the junction surface, not transverse to that surface. Thus any Seebeck current flow will be a circulatory current confined to the p and n conductor layers and this circulating current will flow principally along paths in each conductor which lie parallel with the direction of heat flow. This will result in cooling at the hot junction and heating at the cold junction, but the temperature gradient will be of the form shown in FIG. 4, that is very nearly flat at the midpoint between the junctions, if there is efficient heat-electricity transformation close to the hot junction heat sink 10 and efficient electricity-heat transformation with lower energy throughput close to the cold junction heat sink 16.

Such efficient transformation is to be expected because the heat not involved in the electrical transformation and so conducted thermally along the junction interface is passed on from one part of the junction to the next and has repeated opportunity to engage in the electrical transformation. If the temperature gradient is very nearly flat at the centre and steep at the parts of the junction adjacent the hot and cold heat sinks then a greater energy throughput rate will occur and very little heat energy will be conducted to waste across the centre of the structure. This means that the figure of merit Z will scale up very substantially.

Figure 5:
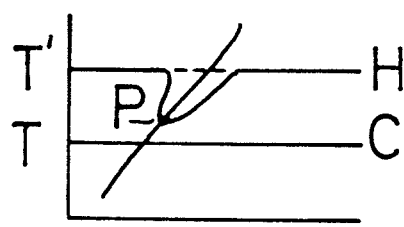
FIG. 5 shows the effect of cold spots in reducing the temperature of the cooled thermocouple junction in Seebeck mode operation.
Figure 6:
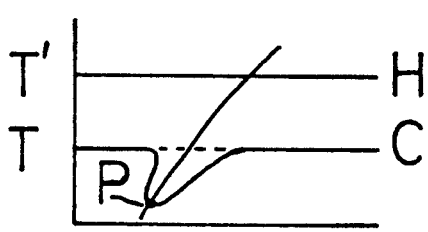
FIG. 6 shows the effect of cold spots in reducing the temperature of the cooled thermocouple junction in Peltier mode operation.

The argument about cold spot formation is illustrated in FIGS. 5 and 6, which refer, respectively, to Seebeck mode operation and Peltier mode operation. In each case a current is assumed to be flowing in a concentrated flow path centred on the full line crossing the hot and cold junction interfaces, denoted H and C. In the Seeback mode the hot junction is cooled by thermoelectric action and so the temperature is shown to dip where the current crosses the junction in FIG. 5. Similarly, in FIG. 6, the cold junction is cooled by thermoelectric action and the temperature dip occurs in this junction. P denotes the cold spot position. It can then be seen how the effective temperature difference is reduced in the Seebeck mode when the current flow becomes locked in position at the cold spot. Similarly the effective temperature differential is increased in the Peltier mode to produce the smaller operating temperature differential in a refrigerating system. In either case, this cold spot action implies a serious loss of efficiency. The heating effect of current at the heated junction will increase resistivity with the result that the current flow across that junction will migrate and so be distributed as is expected by conventional electric theory.

By feature (a) the implementation of the invention to be described achieves, for an aluminium-nickel thermopile, a thermoelectric power in excess of 300 microvolts per degree Centigrade, which suggests some enhancement by the Thomson Effect. Furthermore, concerning feature (c), it is known, from D.C. tests on the thin film bimetallic layers used in one working embodiment, that the bulk conductivity has been enhanced by a factor of 10. The aluminum and nickel films were of 200 and 400 angstrom thickness, respectively. This, plus the third factor (b) implicit in the design based on FIG. 3 combine to increase the figure of merit Z to levels so far above unity as to give an overall theoretical thermal conversion efficiency approaching the Carnot limit. However, there are a number of parasitic losses in the device, such as arise from internal thermoelectric current circulation, eddy currents and normal joule heating. Therefore, the ultimate efficiency which can be achieved depends upon how these are reduced by the development of the manufacturing processes suited to this new method of converting heat and electricity.

At the date when the specification was filed an aluminium-nickel thermopile incorporating, but not optimally realizing, the features described, was operating using a dynamic excitation frequency of 10 kilohertz with a somewhat square external A.C. current waveform. It performed with an external temperature differential of 50 degrees Centigrade, between 20 and 70 degrees Centigrade, to produce an electrical output with a net energy conversion efficiency well above 46% of that set by the Carnot limit. This measure of efficiency also underestimates the true efficiency of the conversion method, because it takes account of all operating effects, including heat loss at the heated surface due to convention and even transformer power losses in the electrical output circuit which provided voltage transformation. This implies that, allowing for all the losses and temperature drops not included in expression [1] as adjusted for the factor 4 to relate to thermal efficiency, the empirical evidence for this aluminium-nickel thermoelectric generator indicates that the equivalent factor of merit Z is greater than 4 times 0.46 divided by 0.54 and also by the hot junction temperature 343 in Kelvin. This is 0.0099. The corresponding nominal Z values for n and p type alloys involving bismuth telluride are a fraction of this, typically 0.0021 and 0.0032 at 50 degrees Centigrade. This means that the base metal thin film aluminium-nickel thermocouple operating according to the invention is far superior in terms of standard performance criteria. Equally important, however, the base metal properties allow a greater energy throughput rate for a given size of thermopile and this has very substantial technological advantages over the semi-conductor devices.

This does not mean, however that this invention cannot be used also to improve the efficiency of bismuth-telluride thermocouple devices. The technique of cyclic interruption of current activation which is to be described has been applied to a commercially available bismuth telluride thermopile and has given a threefold increase in efficiency for Seebeck mode operation. This is deemed as confirmation that the destabilization of the current flow due to cold spot formation at the cooled junctions is present to some extent even in a poor electrical conductor such as an alloy of bismuth telluride.

Referring now to FIGS. 7 to 10, the two metals forming the thermopile will be denoted n and p to signify that the current flow in one involves negative charge carriers and in the other positive charge carriers. This does not necessarily mean that the metals are doped to provide these electrical properties. It is just that the thermoelectric power realized from the choice of metals, when suitably activated electrically, corresponds to the presence of the n-p junction effects at the operating temperatures used.

Figure 7:
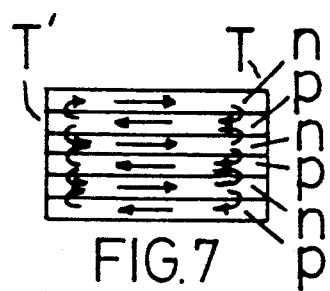
FIG. 7 shows the internal thermoelectric current flow in a layered assembly of n and p type conductors when subject to a transverse temperature gradient produced by Peltier cooling.

The process now to be described by reference to FIGS. 7 to 10 assumes operation in Peltier mode, which means that the cooled junctions are at the lower temperature T. In FIG. 7 alternate layers of n and p metal are stacked with full electrical contact across the facing surfaces forming junction interfaces extending all the way from the heat exchange surface at temperature T' to the heat exchange interface at temperature T. Owing to the temperature differential and ignoring the effect of an externally supplied current, there will be closed circulating currents as shown by the arrows.

Figure 8:
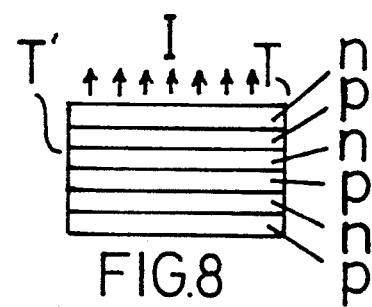
FIG. 8 shows an externally applied current in the FIG. 7 assembly.

Assume now that this same structure is not subjected to temperature differential but carries an electric current in the direction of the arrows shown in FIG. 8. This current I will, in traversing the p-n junction surfaces develop heating and cooling in the alternate layers by the Peltier effect.

Figure 9:
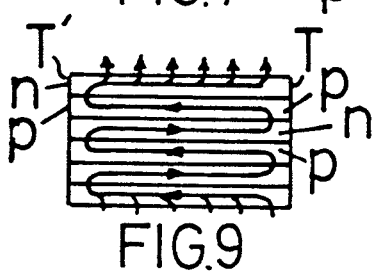
FIG. 9 shows how the two current systems of FIGS. 7 and 8 combine.
Figure 10:
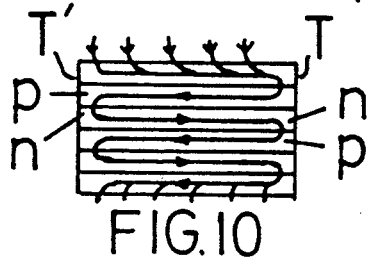
FIG. 10 shows the effect of reversing the externally applied current in FIG. 9.

Suppose now that the two situations just described are combined and that there is a temperature difference $T'-T$. If the current I is suitably matched in strength to the circuital current induced thermoelectrically, it can be seen that the combined current flow path will tend to have a snaking form somewhat as shown in FIG. 9. Note then that the current flow is from p to n at the $T'$ interface and from n to p at the T interface. If the current I is reversed the effect is as shown in FIG. 10. Again, however, the current flow is from p to n at the $T'$ interface and from n to p at the T interface.

In effect, therefore, the full thermoelectric power of a series-connected thermopile is operative in this system and, if the temperature differential $T'-T$ is obtained by use of external current sources, the current I can flow one way or the other without affecting the cooling action. The same structure operates also in Seeback mode to produce a sustained output current when the temperature differential $T'-T$ is provided by heat energy input. Inasmuch as the system has a bistable characteristic a reversal of the current will not affect the action in converting heat into electricity. This property can be used to advantage in applying the thermocouple system to produce electrical output of a predetermined frequency, assuming that appropriate reverse current trigger pulses are applied under suitable control.

It is essential from the point of view of securing optimum performance that the external current I should be closely matched in strength to the thermoelectric steady current circulating in the planar p-n loops. Thus the structure discussed by reference to FIGS. 7 to 10 could be a bismuth-telluride structure not necessarily relying on the dynamic excitation provided by one aspect of this invention. An external circuit D.C. flow through the thermopile and transverse to the thermal gradient may still exploit certain advantages provided by this invention.

Also it is stressed that losses are minimal if the current flow paths are constrained to avoid currents not in the planes shown in the drawings. Thus, ideally, regarding width as the third dimension not shown, the conductor layers should all be of uniform width. This is implicit in the spiral-wound configuration in FIG. 17. What was stated above by reference to the orthogonal x-y-z coordinates for a simple rectangular block thermopile construction is most important. The spiral-wound version would need representation in polar coordinates, but essentially it has the necessary symmetry and there should be no circumferentially directed current flow adding to losses. This is why the capacitor current is caused to flow axially by the use of the end electrodes.

However, the optimum benefits emerge from the use of thin film base metals with dynamic current excitation, meaning that the current I must be reversed or switched off cyclically to frustrate the cold spot current locking action.

Although future research will lead to the preferred methods by which to implement this dynamic current excitation, with possible loss reduction, successful working embodiments of the invention have been constructed by use of electronic circuits designed to conform with the following operating principles.

Figure 11:
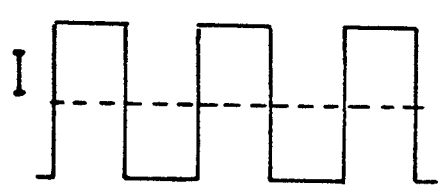
FIG. 11 shows a square wave form of the externally applied current.
Figure 12:
FIG. 12 shows how this current in FIG. 11 is modified by thermoelectric current circulation to become junction current.

Thus, in FIG. 11 a square waveform representing the current I is shown and when added to the circulating thermoelectric current this is deemed to be so matched in strength for the operating temperatures that the actual current flow J across a junction is as shown in FIG. 12. Provided the switching rate is fast enough, this then realizes the full advantages of the dynamic cold spot relocation feature. Furthermore, using thin metal film, the high electrical conductivity feature can be incorporated in the structure, so that a very high factor of merit can be expected.

Figure 13:
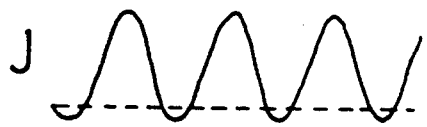
FIG. 13 shows a modified junction current when the applied current is sinusoidal.

If a normal A.C. current waveform is used, helped by a resonant oscillator circuit in the external power loop, the junction current J can have a form such as shown in FIG. 13, allowing for the thermoelectric bias current. Therefore, the thermopile of this invention can operate to generate D.C. or A.C., albeit with some pulse switching or a resonant regulating circuit.

Figure 14:
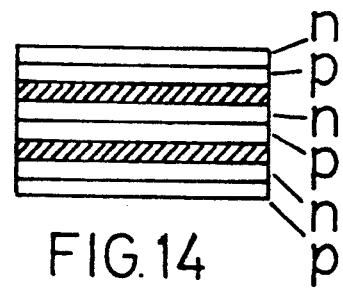
FIG. 14 shows a side section of a layered assembly of p and n type conductors interspersed with dielectric insulating layers.
Figure 15:
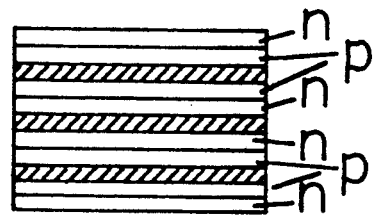
FIG. 15 shows a side section of a similar assembly, but with a different n and p sequence.

Given that the planar conductor layers can with advantage be thin films, and that the device can operate on A.C., it is further possible to interleave layers of dielectric to convert the structure into a capacitor stack as illustrated in FIG. 14, the shaded sections representing the dielectric layers. Then, the sequence of p and n type conductors can be either as illustrated in FIG. 14 or as illustrated in FIG. 15. In FIG. 14, if the dielectric is denoted d, the layer sequence is n-p-d-n-p-d-n-p-d, whereas in FIG. 15 it is n-p-d-p-n-d-n-p-d-p-n. The functional action described by reference to FIGS. 7 to 10 will still apply to this capacitor version, provided the A.C. frequency and A.C. voltage are high enough to set up a current oscillation in the capacitor stack and its external circuit conforming in peak strength with that in the thermoelectric loops. When thin film is used, this A.C. current is quite small and practical capacitative embodiments of this invention will normally use capacitor stacks with the capacitor elements connected partially in series and partially in parallel.

A capacitor version of this structure has provided the test data revealing the above-mentioned net 46% of Carnot thermal efficiency, when operating at 10 kilohertz. This frequency was chosen as the cyclic operating frequency for reasons connected with the design of the capacitor resonant circuit, rather than the dynamic excitation feature (a). For the latter purpose a much lower frequency can suffice to assure and adequate dynamic response, one kilohertz being a resonable minimum.

This test capacitor system was a hand-fabricated prototype and comprised 20 groups each of 15 thermocouple junction pairs, the 20 groups being connected in parallel as individual capacitor stacks each formed by 15 series-coupled capacitative components. The current strength matching of the capacitor current and the thermoelectric loop currents in this composite assembly relies on each capacitative component of the whole assembly being identical in capacitance. This cannot be achieved with perfection in practice and, to the extent that there is peak current mismatch, the system will not function at the maximum possible thermal efficiency. Therefore, the 46% overall efficiency obtained with 300 hand-fabricated thermocouple capacitor components, stands in testimony of a much greater efficiency expected from a production line device.

Figure 16:
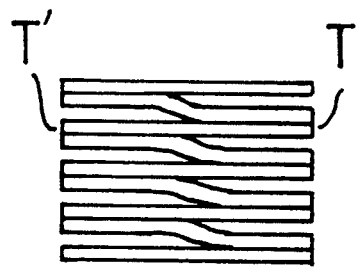
FIG. 16 shows a side section of a series-connected layered assembly of two conductor substances having interface contact over almost all the distance between the thermal surfaces.

FIG. 16 shows how a non-capacitative thermopile arrangement can be assembled to exploit the feature of the invention providing heat flow along the thermocouple junction interface. The figure shows alternate planar conductors of one metallic type interleaved with planar conductors having a kink centrally positioned between the hot thermal surface at temperature T' and the cold thermal surface at temperature T. The interfacing conductors make contact near each thermal surface over at least one third of the distance between the hot and cold surfaces. In this case an externally connected current flow through the composite circuit, whether generated by Seebeck mode operation or supplied to secure the temperature differential by Peltier mode operation, exploits the thermocouple properties by virtue of the feature (b) listed earlier in this specification. However, if this current flow is interrupted to conform with the dynamic excitation feature (a), then the enhanced thermoelectric power is also provided by the structure shown in FIG. 16.

Figure 17:
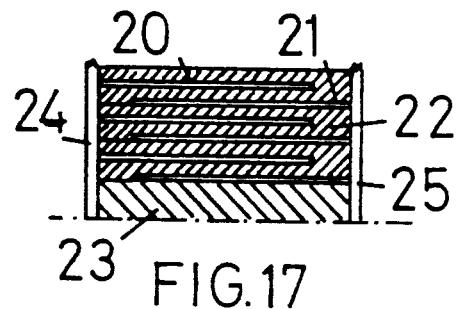
FIG. 17 shows a cross-sectional part view of a spiral-wound conductor and dielectric strip forming a capacitative thermoelectric energy converter having end capacitor electrodes which also provide the thermal surfaces.

To facilitate assembly of a capacitative thermoelectric energy converter using this invention, a spiral-wound device of the form shown schematically in section in FIG. 17 can be used. This represents a wound strip of bimetallic conductor layers and dielectric insulation layers. The strip comprises two composite layers 20, 21 both having interfacing metals A and B with an insulator 22. The strip is shown to be wound three times around the insulating spindle 23 in FIG. 17 to form a capacitor structure having electrical conducting surfaces formed by the layers 20 and 21. In practice there would be hundreds of turns involved in each of several sections connected in series and/or parallel, as by having a suitable printed circuit forming part of interface electrode connections. Thus, layer 20 is staggered along the spindle axis relative to layer 21 so that it can have both heat conducting and electrically conducting contact with one electrode-cum-heat sink 24, with layer 21 making similar contact with another such electrode-cum-heat sink 25. The inner faces of these heat sink end pieces would carry the printed circuits making the capacitor electrode connections and feeding through to end terminals (not shown).

In operation, the existence of a temperature differential between the sinks 24 and 25 can set up circuital thermoelectric currents within the bimetallic layers, which currents are matched in strength to the capacitative current allowed to circulate via an externally connected circuit and the electrodes 24, 25. By the principles already described, the capacitor charging current in each bimetallic layer will tend to cross the junction from metal A to metal B adjacent one heat sink and the capacitor discharge current will tend to cross the junction from metal B to metal A adjacent the other heat sink. This means that there will be an exchange of energy as between the capacitor excitation and the thermal heat sinks.

Concerning the way in which the peak current strength in the external circuit is matched to the thermoelectric current in the bimetallic layers, this requires regulation of the current to detect the matching condition by its effect on the performance of the device. The optimum operating frequency will have been determined by design requirements consistent with avoidance of cold spot effects. However, if the external current supplied to or or drawn from the device is too weak, then the current interruption depicted in FIG. 12 or 13 will not occur and the cold spot effects will reduce the effective Seebeck coefficient and so cause a loss of efficiency. If the current has a peak strength that is just sufficient to preclude cold spot formation, then optimum efficiency is to be expected. However, if it is too high, then there will be a progressive loss of efficiency, the greater the external current.

To regulate the current, therefore, the thermal power and electrical power need to be compared and the current adjusted according to their ratio. In practice, however, given that the operative temperature differential is predetermined and slow to change, the regulation in Seebeck electrical power generating mode can be based on adjustments which progressively change the peak current drawn from the device. This may involve load control techniques including voltage ratio adjustment on a power transformer delivering current output. The action should be to monitor the rate of fall of power output on constant load to increase the peak current if the fall rate is rapid and decrease the peak current if the fall rate is slow, holding the peak current steady should the power output be increasing. Such techniques can usefully provide calibration data which can be applied in controlling the reverse action when operating in Peltier mode where the load conditions are more stable.

Figure 18:
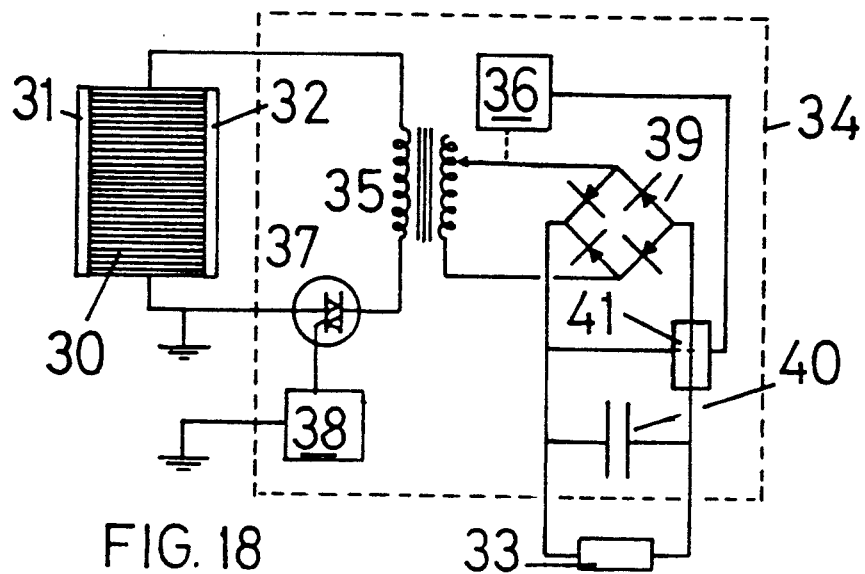
FIG. 18 shows the circuit arrangement of thermoelectric energy conversion apparatus providing the electrical control and current interruption features of the invention.

Referring to FIG. 18, a thermoelectric energy conversion apparatus comprises a thermopile 30 supplied by heat on one surface 31 and cooled at the opposite surface 32. It operates in Seebeck mode to generate an electrical power output and has the block conductor form discussed by reference to FIGS. 7 to 10, the series conductor form of FIG. 16 or the capacitative form discussed by reference to FIGS. 14, 15 or 17.

The electrical circuit from the thermopile supplies an external power system or load 33 via an electrical control unit 34 shown bounded by the dotted lines. This control unit comprises a ferrite cored electrical transformer 35, which has a variable transformer ratio, depicted by the tap change connection on the secondary winding operated by the voltage regulator 36. Also, in the primary circuit there is an electronic SCR type switch 37 controlled by an oscillator 38, which requires very little electrical power input from an external source or from the load 33. The secondary winding on transformer 35 supplies a full-wave rectifier bridge circuit 39 which feeds a smoothing capacitor 40 and then the load 33. The D.C. power output is measured by the wattmeter unit 41 which generates an electrical output signal which is supplied to the regulator 36. Thus the wattmeter unit has connections which sense the output voltage and the output current, whilst the regulator 36 responds to the measured power to adjust the transformer voltage to secure optimum operating conditions.

Given a fixed load 33, the current drawn from the thermopile will depend upon the voltage ratio of the transformer. The role of the regulator is to so adjust the A.C. current drawn through the thermopile as to ensure that the junction current is matched in peak strength to the thermoelectric action. This junction current has to be predominantly unidirectional, as is shown, for example, in FIG. 13, but the reverse current flow should be minimal. With the thermopile form shown in FIG. 16 the external current flowing through the transformer winding will have a significant D.C. component, but for the other thermopile forms already mentioned, it will be an A.C. form with little or no D.C. component. In practice, with the normal A.C. operation, the most direct way of detecting the matched current condition will be by sensing the resulting energy conversion efficiency.

This depends upon the temperature differential operating the thermopile, which changes only slowly. Therefore, given a steady temperature differential, the regulator 36 can be operated manually and systematically to step the voltage ratio up and down in a search for the optimum setting about which it can be cycled. Preferably, this is implemented by an automatic servo-control, which allows for the fact that the output electrical power will fall more rapidly if the peak current is too low than it does if it is too high. There are many ways in which the detailed circuitry of such a regulator can be implemented using suitable electronic techniques involving signal data storage and rate of change measurements. Such a circuit is not disclosed as the design requirements will be obvious to those skilled in the appropriate art.

The oscillator 38 governs the circuit interruption frequency which prevents the cold spot formation at the cooled junctions in the thermopile. However, in a capacitative system the frequency is set principally by the need to establish a good tuning and high Q factor in the resonant circuit. This is essential in order to enhance the operating voltage and operating current of the system and secure more throughput power. Thus, in one prototype capacitor system tested, a frequency of 500 kHz was used and the device operated to show how a melting block of ice thawing in room temperature conditions could drive an electric motor and regenerate all the power needed to operate the electronic circuit. In another test capacitative device, as already noted, a frequency of 10 kHz was sufficient to secure a highly efficient implementation with a 50 degree Centigrade operating differential, even with a low Q factor. If, however, the thermopile is non-capacitative, being of the block conductor or series connected conductor form, then a much lower junction current interruption frequency suffices, the optimum depending upon the combination of thermoelectric conductor substances used.

In the circuit shown in FIG. 18, using a capacitative thermopile, the resonant circuit is formed by the inherent capacitance of the layered assembly forming the thermopile 30. Also there will be inductance partly from this assembly but mainly from the primary of transformer 35. However, this does not preclude the incorporation of special capacitors and even inductors to secure better performance at a different operating frequency.

It is to be noted that the throughput power capacity of the thermoelectric energy conversion system provided by this invention is very high, inasmuch as it exceeds the normal thermal conductive capacity of the conductors used. Even in a capacitative structure using thin film planar metal layers of less than 0.1 micron in thickness with interleaved 28 micron dielectric layers, the power throughput capacity is measured in kilowatts per square meter at a 50 degree temperature differential. This combined with the high efficiency at low temperature differentials makes this invention eminently suited to applications in which electricity is generated from low grade ambient heat sources, typically in the range of water temperature. However, the principles of the invention apply over the full spectrum of temperatures at which the conductors remain solid, including cryogenic temperatures.

Concerning the importance of the use of thin metal film, the enhancement of electrical conductivity as an inherent physical property of thin films is a major factor contributing to performance. The use of thin film is not dictated by the need to have a large number of junctions so as to enhance the voltage rating, as the current rating imposes a minimum limit on the conductor thickness. Therefore, to exploit the higher electrical conductivity of thin films in a thermoelectric converter using the invention it will normally be necessary to connect a multiplicity of junction circuits in parallel so as to divide the current flow. Thin film embodiments are less subject to thermal heat loss by conduction and so more efficient. However, where cost of manufacture and overall power throughput are vital considerations, the features of the invention used in conjunction with thicker bimetallic conductors can be of significant commercial significance and so may be preferred.

We claim:

1. A thermoelectric energy conversion apparatus comprising a thermopile formed by a laminar assembly of two conductor substances A and B located between external thermal surfaces across which heat is transferred when the surfaces have different temperatures, there being thermocouple junctions formed between the substances A and B, providing, from A to B an A-B junction interface and from B to A a B-A junction interface, and a current flow path connected to electrical circuit means including an electrical control unit linked to an external power system, characterized in that said electrical control unit comprises:
   (a) means for admitting a regulated current to flow through said junctions which is predominantly unidirectional at each junction,
   (b) means for interrupting the current flow cyclically at a steady frequency,
   (c) means for measuring the electrical power throughput, and
   (d) current regulating means for adjusting the peak strength of current flowing between the external power system and the laminar assembly forming the thermocouple junctions, the current regulating means operating to adjust progressively the peak current strength to search for and sustain flow at a threshold peak current level at which the maximum electrical power throughput occurs when the apparatus operates in Seebeck mode.

2. A thermoelectric energy conversion apparatus comprising a thermopile formed by a laminar assembly of two conductor substances A and B located between external heat sink surfaces across which heat is transferred when the surfaces have different temperatures, there being pairs of thermocouple junctions formed between the substances A and B, activated by thermoelectric action powered by the temperature difference to cause current flow from A to B at an A-B junction interface and current flow from B to A at a B-A junction interface, and a supplementary current flow path connected to electrical circuit means including an electrical control unit linked to an external power system, the apparatus being characterized in that, in combination,
   (a) the A-B and B-A junctions of each thermocouple pair are both formed by surfaces of contact between the same pair of laminar conductor elements of substances A and B, and
   (b) said electrical control unit comprises means for admitting a regulated current to flow along that supplementary current path and through said laminar assembly in a direction transverse to the laminar surfaces of the conductor elements and means for modulating the current cyclically at a frequency in excess of one kilohertz, which current augments and offsets the thermoelectric current at the respective A-B and B-A junctions to cause the weaker junction current to be minimal and the stronger junction current to be predominantly unidirectional but subject to cyclic interruption at the modulating frequency.

3. A thermoelectric energy conversion apparatus according to claim 2, characterized in that a laminar assembly of planar conductor elements alternately of substances A and B has electrical contact over all interfacing A and B surfaces and the same adjacent pairs of elements form thermocouple junctions in thermally-coupled proximity with both heat surfaces, said electrical control unit being operative to regulate the current flowing transversely through the assembly and so interacting with the thermoelectrically powered current in the planar conductors to concentrate junction current action at one heat surface into flow through A-B junctions and junction current action at the other heat surface into flow through the B-A junctions.

4. A thermoelectric energy conversion apparatus comprising a thermopile formed by a laminar assembly of pairs of conductor elements of substances A and B and dielectric elements of an insulating substance separating each pair of conductor elements located between external heat sink surfaces across which heat is transferred when the surfaces have different temperatures, each such conductor pair thereby comprising a closed conductor circuit activated by thermoelectric action powered by the temperature difference to cause current flow from A to B at an A-B junction interface and current flow from B to A at a B-A junction interface, and a supplementary current flow path connected to electrical circuit means including an electrical control unit linked to an external power system, the apparatus being characterized in that it constitutes a capacitor and said electrical control unit comprises oscillator means for admitting a regulated capacitor current to flow along that supplementary current path and through said laminar assembly in a direction transverse to the laminar surfaces of the conductor elements, which current augments and offsets the thermoelectric current selectively at the respective A-B and B-A junctions to cause the weaker junction current to be minimal and the stronger junction current to be predominantly unidirectional but subject to cyclic interruption at the oscillation frequency.

5. A thermoelectric energy conversion apparatus according to claim 4, characterized in that a laminar assembly of conductor elements alternately of conductor substances A and B interspersed with dielectric elements d in a sequence A-B-d-A-B-d etc. has electrical contact over all interfacing A and B surfaces and the same adjacent pairs of conductor elements form thermocouple junctions in thermally-coupled proximity with both heat surfaces, said electrical control unit being operative to regulate the current flowing transversely through the assembly and so interacting with the thermoelectrically powered current in the conductor elements to concentrate junction current action at one heat surface into flow through A-B junctions and junction current action at the other heat surface into flow through the B-A junctions.

6. A thermoelectric energy conversion apparatus according to claim 2, comprising an insulating support member having end pieces which serve as heat sinks, whereby their temperature difference sets up a temperature gradient parallel with the central axis of the support member, and a thermopile formed by a multi-turn ribbon-like strip spiral-wound around the support member and located between the end pieces, the strip comprising two conductor substances A and B contiguously formed as a ribbon in which a layer of substance A interferes with a layer of substance B, whereby thermocouple junction interfaces formed between A and B along both edges of the strip abut with an end piece and have heat transfer coupling with the heat sink surface of an associated end piece, thereby forming a spiral-wound laminar assembly which, in respect of a supplementary current flow path transverse to the axis of the support member and so radial with respect to the axis, is through a multiple sequence of junctions A-B-A-B-A-B in which each turn of the winding constitutes a thermocouple junction pair.

7. A thermoelectric energy conversion apparatus according to claim 4, comprising an insulating support member having end pieces which serve as heat sinks, whereby their temperature difference sets up a temperature gradient parallel with the central axis of the support member, and a thermopile formed by a multi-turn ribbon-like strip spiral-wound around the support member and located between the end pieces, the strip comprising a dielectric insulator d having two conductor substances A and B contiguously formed with the insulator as a ribbon in which a layer of substance A interferes with a layer of substance B, whereby thermocouple junction interfaces are formed between A and B along both edges of the strip, and each of the two edges of the strip abut with an end piece to have heat transfer coupling with the heat sink surface of an associated end piece, thereby forming a spiral-wound laminar assembly which, in respect of a supplementary current flow path for capacitor current, is transverse to the axis of the support member and so radial with respect to that axis and through a multiple sequence of junctions A-B-d-A-B-d-A-B-d etc in which each turn of the winding constitutes a thermocouple junction pair.

8. A thermoelectric energy conversion apparatus according to claim 4, comprising an insulating support member having end pieces which serve as heat sinks, whereby their temperature difference sets up a temperature gradient parallel with the central axis of the support member, and a thermopile is formed by two multi-turn ribbon-like strips spiral-wound around the support member and located between the end pieces, the strips comprising a dielectric insulator having two conductor substances A and B contiguously formed with the insulator as a ribbon in which a layer of substance A interferes with a layer of substance B, whereby thermocouple junction interfaces are formed between A and B along both edges of the strips, and each of the two edges of the strip abut with an end piece to have heat transfer coupling with an associated heat sink surface, the conductor layers of each strip being connected to a separate electrode, thereby forming a spiral-wound laminar assembly which constitutes a capacitor having two electrode connections.

9. Thermoelectric energy conversion apparatus according to claim 8, characterized in that the two strips are formed with the conductor layers respectively staggered in opposite directions with respect to the support member axis and these respective conductor layers have electrical and thermal contact with end pieces which constitute the respective heat sink surfaces and on which printed circuits provide electrical connection means for capacitor electrodes.

10. Thermoelectric energy conversion apparatus according to claim 1, utilizing base metal substances A and B which are respectively electropositive and electronegative in their thermoelectrical conduction characteristics at the operating temperatures of the apparatus.

11. Thermoelectric energy conversion apparatus according to claim 1, utilizing substances A and B that have metallic conduction properties and are respectively electropositive and electronegative in their thermoelectrical conduction characteristics, at least one of the substances being ferromagnetic.

12. Thermoelectric energy conversion apparatus according to claim 4, utilizing substances A and B that have metallic conduction properties and are respectively electropositive and electronegative in their thermoelectrical conduction characteristics, at least one of the substances being ferromagnetic, characterized in that said oscillator means for admitting a regulated capacitor current to flow through the laminar assembly operates at a frequency which is tuned to the resonant frequency of the laminar assembly.

* * * * *